United States Patent
Cao

(10) Patent No.: US 9,249,499 B2
(45) Date of Patent: Feb. 2, 2016

(54) COATED ARTICLE AND METHOD FOR MAKING SAME

(75) Inventor: Da-Hua Cao, Shenzhen (CN)

(73) Assignees: SHENZHEN FUTAIHONG PRECISION INDUSTRY CO., LTD., Shenzhen (CN); FIH (Hong Kong) Limited, Kowloon (HK)

( * ) Notice: Subject to any disclaimer, the term of this patent is extended or adjusted under 35 U.S.C. 154(b) by 619 days.

(21) Appl. No.: 13/614,611

(22) Filed: Sep. 13, 2012

(65) Prior Publication Data
US 2013/0244012 A1  Sep. 19, 2013

(30) Foreign Application Priority Data

Mar. 16, 2012 (CN) .......................... 2012 1 0070120

(51) Int. Cl.
| | |
|---|---|
| *C23C 14/35* | (2006.01) |
| *C23C 14/00* | (2006.01) |
| *C23C 14/02* | (2006.01) |
| *C23C 14/06* | (2006.01) |
| *C23C 14/16* | (2006.01) |
| *C23C 28/00* | (2006.01) |
| *C23C 12/02* | (2006.01) |
| *B32B 15/04* | (2006.01) |
| *H04M 1/02* | (2006.01) |

(52) U.S. Cl.
CPC .............. *C23C 14/35* (2013.01); *B32B 15/043* (2013.01); *C23C 12/02* (2013.01); *C23C 14/0015* (2013.01); *C23C 14/024* (2013.01); *C23C 14/0635* (2013.01); *C23C 14/0641* (2013.01); *C23C 14/0664* (2013.01); *C23C 14/16* (2013.01); *C23C 28/322* (2013.01); *C23C 28/341* (2013.01); *B32B 2255/06* (2013.01); *B32B 2255/26* (2013.01); *B32B 2307/402* (2013.01); *B32B 2457/00* (2013.01); *H04M 1/0202* (2013.01); *Y10T 428/24942* (2015.01); *Y10T 428/26* (2015.01); *Y10T 428/31663* (2015.04)

(58) Field of Classification Search
CPC .............. B32B 15/043; B32B 2255/06; B32B 2255/26; B32B 2307/402; B32B 457/00; C23C 12/02; C23C 14/0015; C23C 14/024; C23C 14/0635; C23C 14/0641; C23C 14/0664; C23C 14/16; C23C 14/35; C23C 28/322; C23C 28/341; Y10T 428/24942; Y10T 428/26; Y10T 428/31663
USPC ................................................. 428/212, 220
See application file for complete search history.

(56) References Cited

U.S. PATENT DOCUMENTS

| | | | | |
|---|---|---|---|---|
| 4,358,507 | A | * 11/1982 | Senaha et al. ................. | 428/429 |
| 4,549,187 | A | * 10/1985 | Levy .............................. | 343/897 |
| 4,661,423 | A | * 4/1987 | Ueno et al. .................... | 429/498 |
| 5,536,335 | A | 7/1996 | Burris | |
| 5,565,052 | A | * 10/1996 | Papenburg et al. ........... | 156/155 |

FOREIGN PATENT DOCUMENTS

CN          101876327 A          11/2010

* cited by examiner

*Primary Examiner* — Aaron Austin
*Assistant Examiner* — Lawrence Ferguson
(74) *Attorney, Agent, or Firm* — Novak Druce Connolly Bove + Quigg LLP

(57) ABSTRACT

A coated article includes a metal substrate, a carbosiliconized layer formed on the metal substrate, a metal bonding layer formed on the carbosiliconized layer, and a color layer formed on the metal bonding layer. The carbosiliconized layer is formed by carbosiliconizing the metal substrate to enable elemental carbon and elemental silicon to penetrate into a surface layer of the metal substrate. The color layer consists of ceramic material. A method for making the coated article is also described.

8 Claims, 2 Drawing Sheets

COATED ARTICLE AND METHOD FOR MAKING SAME

BACKGROUND

1. Technical Field

The present disclosure relates to coated articles having high hardness coatings and a method for making the coated articles.

2. Description of Related Art

Films made by physical vapor deposition (hereinafter referred to as "PVD films") are often used on articles, such as housings of electronic devices. A coated article with a decorative PVD film having a thickness of about 2 μm-4 μm usually has a surface hardness of only about 600 HV 0.025. Therefore, an increased thickness of the decorative PVD film is needed to achieve an increased surface hardness. However, increasing the film thickness requires a high manufacturing cost. Moreover, an increased thickness causes a lower brightness appearance of the PVD film.

Therefore, there is room for improvement within the art.

BRIEF DESCRIPTION OF THE DRAWINGS

Many aspects of the disclosure can be better understood with reference to the following figures. The components in the figures are not necessarily drawn to scale, the emphasis instead being placed upon clearly illustrating the principles of the disclosure.

DETAILED DESCRIPTION

Figure 1:
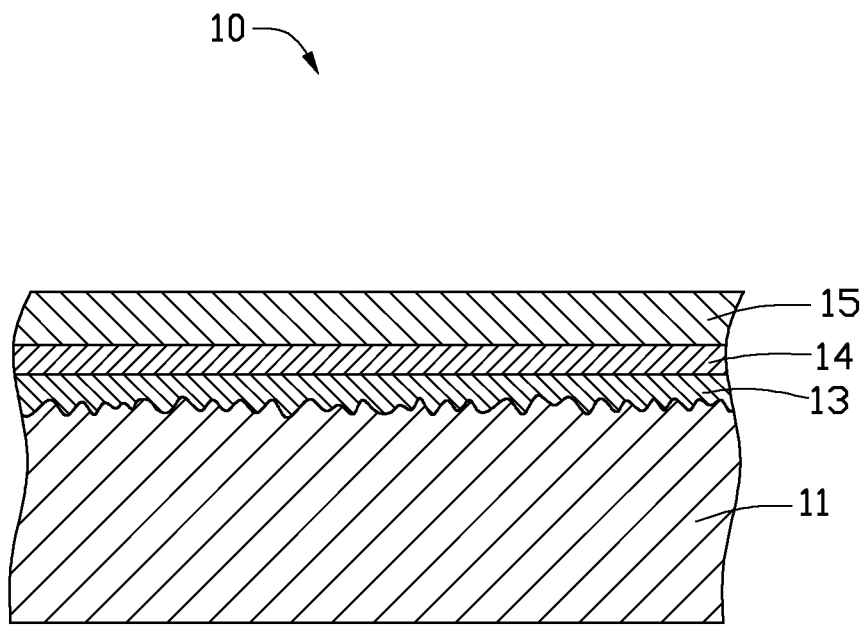
FIG. 1 is a cross-sectional view of an exemplary embodiment of the present coated article.

FIG. 1 shows an exemplary embodiment of a coated article 10. The coated article 10 includes a metal substrate 11, a carbosiliconized layer 13 directly formed on the substrate 11, a bonding layer 14 directly formed on the carbosiliconized layer 13, and a color layer 15 directly formed on the bonding layer 14. As used in this disclosure, "directly" means a surface of one layer is in contact with a surface of the other layer.

The substrate 11 may be made of iron-based alloy, such as stainless steel. The substrate 11 may also be made of titanium alloy or aluminum alloy.

The carbosiliconized layer 13 is formed by carbosiliconizing the surface of the substrate 11 to enable elemental carbon and elemental silicon to penetrate into a surface layer of the substrate 11. The carbosiliconized layer 13 contains elemental carbon, elemental silicon, and chemical elements contained within the substrate 11 besides elemental carbon and elemental silicon. The elemental carbon within the carbosiliconized layer 13 has a weight percentage of about 0.12% to about 0.42% greater than the weight percentage of the elemental carbon within the substrate 11. The elemental silicon within the carbosiliconized layer 13 has a weight percentage of about 0.05% to about 0.3% greater than the weight percentage of the elemental silicon within the substrate 11. The elemental carbon and elemental silicon may exist as silicon carbide, silicon, and carbon within the carbosiliconized layer 13. The thickness of the carbosiliconized layer 13 may be about 0.1 mm to about 0.3 mm.

The bonding layer 14 is made of a metal having a coefficient of thermal expansion approximately equal to the coefficient of thermal expansion of the substrate 11. For example, if the substrate 11 is made of stainless steel, the bonding layer 14 is preferably chromium. The bonding layer 14 improves the attachment strength of the color layer 15. The thickness of the bonding layer 14 may be about 0.1 μm to about 0.3 μm.

The color layer 15 may consist of ceramic material, such as metal nitride, metal carbide, metal oxynitride, or metal carbonitride. For example, the color layer 15 may consist of a material selected from the group consisting of chromium carbide, chromium nitride, chromium oxynitride, carbide titanium, nitride titanium, and titanium carbonitride. The color layer 15 provides a desired color for the coated article 10. Preferably, the color layer 15 has a high hardness to be abrasion resistant.

In one embodiment, the color layer 15 substantially consists of elemental carbon and elemental chromium. The atomic ratio of the elemental carbon and elemental chromium within the color layer 15 may be about 1:(0.3-1). Furthermore, the mass percentages of the elemental carbon within the color layer 15 is gradually increased from the bottom of the color layer 15 near the bonding layer 14 to the top of the color layer 15 away from the bonding layer 14. The color layer 15 may have a thickness of about 2.0 μm to about 2.5 μm.

The bonding layer 14 and the color layer 15 can be formed by magnetron sputtering. The coated article 10 may be a housing of mobile phone, personal digital apparatus, notebook computer, portable music player, GPS navigator, or digital camera.

The carbonsliliconized layer 13 contains silicon carbide which has a high hardness, providing a hard base for the bonding layer 14 and the color layer 15, and improving a compound surface hardness of the coated article 10.

A method for manufacturing the coated article 10 may include: providing the metal substrate 11; carbosiliconizing the surface of the substrate 11 to form the carbosiliconized layer 13; magnetron sputtering the bonding layer 14 on the carbosiliconized layer 13; and magnetron sputtering the color layer 15 on the bonding layer 14.

Figure 2:
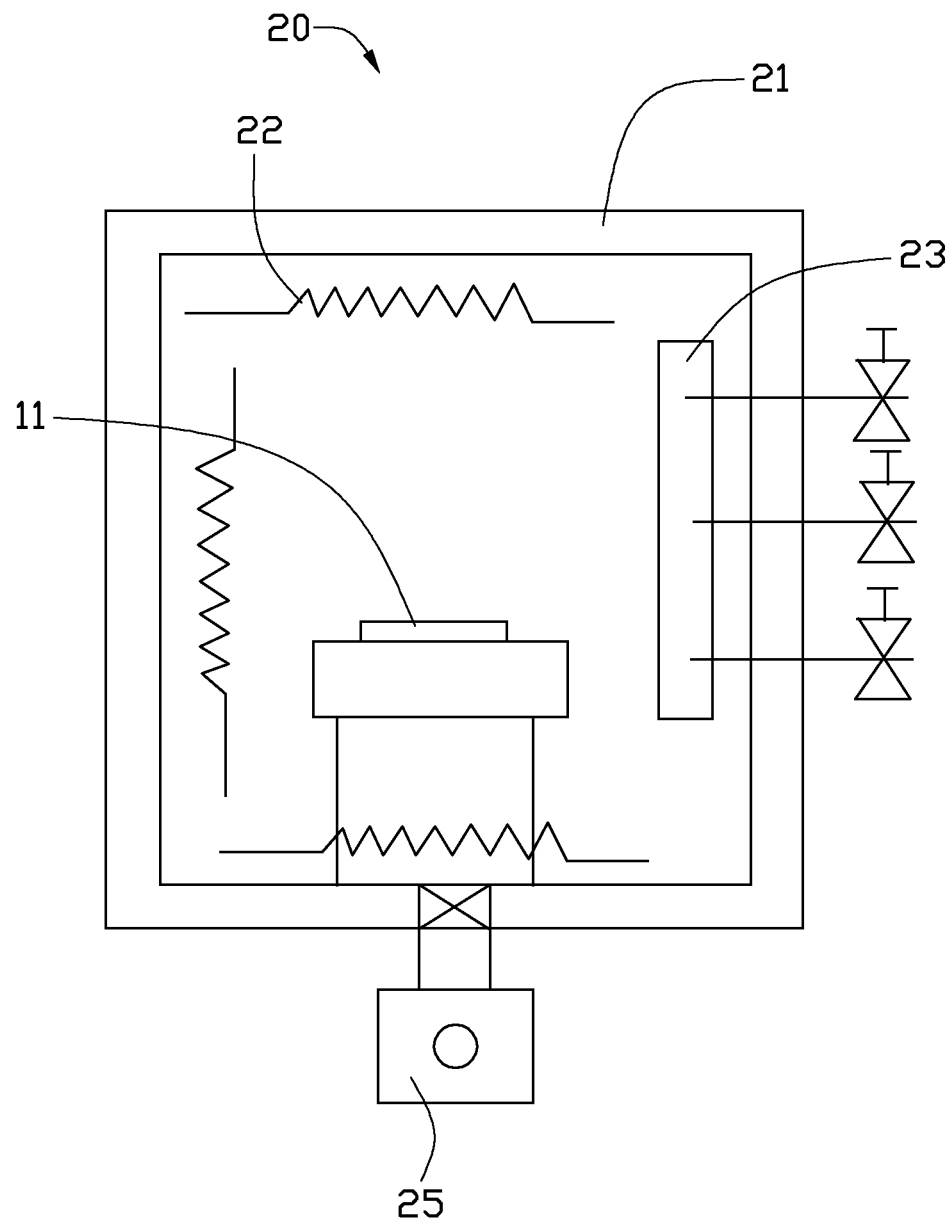
FIG. 2 is a schematic view of a plasma carbosiliconizing device for manufacturing the coated article of FIG. 1.

The carbosiliconizing process can be carried out in a plasma carbosiliconizing device 20 as shown in FIG. 2. The plasma carbosiliconizing device 20 includes a vacuum furnace 21, heating elements 22 for heating the substrate 11, a ion source 23 positioned in the vacuum furnace 21, and a vacuum pump 25 connected to the vacuum furnace 21 for evacuating the vacuum furnace 21. The ion source 23 is used to ionize gases containing elemental carbon and elemental silicon and provide the ionized gas containing carbon ions and silicon ions into the vacuum furnace 21.

During the carbosiliconizing process, the substrate 11 is placed into the vacuum furnace 21. The vacuum furnace 21 is evacuated to an internal pressure of about 0.1 Pa to about 1.0 Pa. The substrate 11 is heated to maintain a temperature of about 450° C. to about 600° C. Methane, silane, and inert gas (such as argon) are fed into the ion source 23. The ratio of the flow rates between the methane, silane, and inert gas may be about (1-2):(1-2):(2-3). The methane and silane are ionized into ionized gas containing carbon ions and silicon ions and enter the vacuum furnace 21, increasing the internal pressure of the vacuum furnace 21 to be about 0.5 Pa to about 2.5 Pa. Carbon ions and silicon ions contained in the ionized gas strike the substrate 11 and penetrate into the surface layer of the substrate 11, forming the carbosiliconized layer 13. The carbosiliconizing process may take about 180 minutes to about 300 minutes.

When the carbosiliconizing process is finished, cooling gas (such as argon) may be fed into the vacuum furnace 21 to cool the substrate 11. The substrate 11 is then taken out of the vacuum furnace 21.

Magnetron sputtering the bonding layer 14 includes, under sputtering conditions, applying an electric power to a first target to sputter the first target material onto the carbosiliconized layer 13 and deposit the bonding layer 14. The first target is a metal having a coefficient of thermal expansion approximately equal to the coefficient of thermal expansion of the substrate 11. For example, if the substrate 11 is made of stainless steel, the first target is preferably chromium.

Magnetron sputtering the color layer 15 includes, under sputtering conditions, using reaction gas selected from oxygen, acetylene, nitrogen, and any combination thereof; applying an electric power to a second target to sputter the second target material onto the bonding layer 14 and deposit the color layer 15. The second target is a metal, such as chromium or titanium.

The sputtering conditions include: using an inert gas (such as argon) having a flow rate of about 150 Standard Cubic Centimeters per Minute (sccm) to about 250 sccm as a sputtering gas; conducting the magnetron sputtering at an sputtering pressure of about 0.3 Pa to about 0.6 Pa and at a sputtering temperature of about 130° C. to about 180° C. The sputtering pressure means an internal absolute pressure of a chamber for implementing a sputtering during the magnetron sputtering process. The sputtering temperature means an internal temperature of the chamber for implementing a sputtering during the magnetron sputtering process.

The electric power may be provided by any power source for magnetron sputtering, such as intermediate frequency power source.

Specific examples of making the coated article 10 and comparison examples are described as following. The specific examples mainly emphasize the different process parameters for making the coated article 10.

Example 1

A sample of 304-type stainless steel substrate 11 was cleaned with alcohol in an ultrasonic cleaner.

The substrate 11 was placed into the vacuum furnace 21 of the plasma carbosiliconizing device 20. The vacuum furnace 21 was evacuated to an internal pressure of about 0.1 Pa. The substrate 11 was maintained at a temperature of about 450° C. Methane, silane, and argon were fed into the ion source 23. The ratio of the flow rates between the methane, silane, and argon was about 1:1:2. The methane and silane gas were ionized and entered the vacuum furnace 21, causing the internal pressure of the vacuum furnace 21 to be about 0.5 Pa. Carbon ions and silicon ions contained in the ionized gas stroked the substrate 11 and penetrated into the surface layer of the substrate 11, forming the carbosiliconized layer 13. The carbosiliconizing process took about 180 minutes.

The substrate 11 having the carbosiliconized layer 13 was placed into a vacuum chamber of a magnetron sputtering machine (not shown). The magnetron sputtering machine further included a rotating bracket and at least one pair of chromium targets inside the vacuum chamber. The rotating bracket rotated the substrate in the chamber relative to the chromium targets.

The vacuum chamber was evacuated to maintain an internal pressure of about $6.0 \times 10^{-3}$ Pa. The internal temperature of the vacuum chamber was maintained at about 130° C. (namely sputtering temperature). Argon gas was fed into the vacuum chamber to create an internal pressure (namely sputtering pressure) of about 0.3 Pa. A bias voltage of about −100 V was applied to the substrate 11. About 10 kW of power was applied to the chromium targets, depositing a bonding layer 13 consisting of chromium on the carbosiliconized layer 13. The deposition of the bonding layer 13 took about 15 minutes. The thickness of the bonding layer 13 was about 0.25 μm.

The power applied to the chromium targets was adjusted to be 11 kW. Acetylene as reaction gas having an initial flow rate of about 50 sccm was fed into the vacuum chamber 31, deposited a color layer 15 consisted of elemental chromium and elemental carbon on the bonding layer 14, with other parameters the same as during deposition of the bonding layer 14. During the deposition process, the flow rate of the acetylene increased at a rate of about 1 sccm per 4 minutes, until a peak value of about 80 sccm was achieved. The content of the elemental carbon within the color layer 15 gradually increased from the bottom of the color layer 15 near the bonding layer 14 to the top of the color layer 15 away from the bonding layer 14. The deposition of the color layer 15 took about 120 minutes. The thickness of the color layer 15 was about 2.4 μm.

The sample of example 1 was marked as S1. The S1 had a bright appearance under naked-eye observation.

Example 2

A sample of 304-type stainless steel substrate 11 was cleaned with alcohol in an ultrasonic cleaner.

The substrate 11 was placed into the vacuum furnace 21 of the plasma carbosiliconizing device 20. The vacuum furnace 21 was evacuated to an internal pressure of about 1.0 Pa. The substrate 11 was maintained at a temperature of about 600° C. Methane, silane, and argon are fed into the ion source 23. The ratio of the flow rates between the methane, silane, and argon was about 2:2:3. The methane and silane gas were ionized and entered the vacuum furnace 21, causing the internal pressure of the vacuum furnace 21 to be about 2.0 Pa. Carbon ions and silicon ions contained in the ionized gas stroked the substrate 11 and penetrated into the surface layer of the substrate 11, forming the carbosiliconized layer 13. The carbosiliconizing process took about 300 minutes.

The substrate 11 having the carbosiliconized layer 13 was placed into a vacuum chamber of a magnetron sputtering machine (not shown). The magnetron sputtering machine further included a rotating bracket and at least one pair of chromium targets inside the vacuum chamber. The rotating bracket rotated the substrate in the chamber relative to the chromium targets.

The vacuum chamber was evacuated to maintain an internal pressure of about $5.0 \times 10^{-3}$ Pa. The internal temperature of the vacuum chamber was maintained at about 180° C. Argon gas was fed into the vacuum chamber to create an internal pressure of about 0.7 Pa. A bias voltage of about −150 V was applied to the substrate 11. About 18 kW of power was applied to the chromium targets, depositing a bonding layer 13 consisted of chromium on the carbosiliconized layer 13. The deposition of the bonding layer 13 took about 5 minutes. The thickness of the bonding layer 13 was about 0.2 μm.

The power applied to the chromium targets was adjusted to be 19 kW. Acetylene as reaction gas having an initial flow rate of about 60 sccm was fed into the vacuum chamber 31, deposited a color layer 15 consisted of elemental chromium and elemental carbon on the bonding layer 14, with other parameters the same as during deposition of the bonding layer 14. During the deposition process, the flow rate of the acetylene increased at a rate of about 1 sccm per 2 minutes, until a peak value of about 90 sccm was achieved. The content of the elemental carbon within the color layer 15 gradually increased from the bottom of the color layer 15 near the bonding layer 14 to the top of the color layer 15 away from the bonding layer 14. The deposition of the color layer 15 took about 60 minutes. The thickness of the color layer 15 was about 2.2 μm.

The sample of example 2 was marked as S2. The S2 had a bright appearance under naked-eye observation.

Comparison Example 1

Unlike the example 1, in the comparison example 1, the substrate 11 was not treated by the carbosiliconizing process. Except the above difference, the remaining experiment conditions of comparison example 1 were same with example 1.

The sample of comparison example 1 was marked as C1.

Comparison Example 2

Unlike the example 2, in the comparison example 2, the substrate 11 was not treated by the carbosiliconizing process. Except the above difference, the remaining experiment conditions of comparison example 2 were same with example 2.

The sample of comparison example 2 was marked as C2.

Results

The vickers hardness and pencil hardness of the surfaces of the samples S1, S2, C1, and C2 were tested. The scratch resistance of the samples S1, S2, C1, and C2 was tested by a scratch rod test. The results of the above tests are shown in the table 1.

TABLE 1

| Samples | Vickers Hardness | Pencil hardness | Scratch Resistance |
|---------|------------------|-----------------|--------------------|
| S1 | 806HV | ≥6H | no peel off under 20N |
| C1 | 578HV | 4H | obvious peel off under 20N |
| S2 | 815HV | ≥6H | no peel off under 20N |
| C2 | 580HV | 4H | obvious peel off under 20N |

The test results show that, the carbosiliconizing for the substrate 11 before forming the PVD films (the bonding layer 14 and the color layer 15) on the substrate 11 improves the surface hardness and scratch resistance of the coated article 10, without increasing the thickness of the PVD films.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
a metal substrate;
a carbosiliconized layer formed on the metal substrate, the carbosiliconized layer formed by carbosiliconizing the metal substrate to enable elemental carbon and elemental silicon to penetrate into a surface layer of the metal substrate;
a bonding layer formed on the carbosiliconized layer, the bonding layer made of metal; and
a color layer formed on the bonding layer, the color layer consisting of ceramic material;
wherein the elemental carbon within the carbosiliconized layer has a weight percentage of about 0.12% to about 0.42% greater than the weight percentage of the elemental carbon within the metal substrate; the elemental silicon within the carbosiliconized layer has a weight percentage of about 0.05% to about 0.3% greater than the weight percentage of the elemental silicon within the metal substrate.

2. The coated article as claimed in claim 1, wherein the elemental carbon and elemental silicon exist as silicon carbide, silicon, and carbon within the carbosiliconized layer.

3. The coated article as claimed in claim 1, wherein the thickness of the carbosiliconized layer is about 0.1 mm to about 0.3 mm.

4. The coated article as claimed in claim 1, wherein the metal substrate is made of iron-based alloy.

5. The coated article as claimed in claim 1, wherein the metal substrate is made of stainless steel; the bonding layer is made of chromium.

6. The coated article as claimed in claim 1, wherein the color layer is made of a material selected from the group consisting of metal nitride, metal carbide, metal oxynitride, and metal carbonitride.

7. The coated article as claimed in claim 6, wherein the color layer is made of a material selected from the group consisting of chromium carbide, chromium nitride, chromium oxynitride, carbide titanium, nitride titanium, and titanium carbonitride.

8. The coated article as claimed in claim 1, wherein the color layer substantially consists of elemental carbon and elemental chromium; the atomic ratio of the elemental carbon and elemental chromium within the color layer is about 1:(0.3-1); the mass percentages of the elemental carbon within the color layer gradually increases from the bottom of the color layer near the bonding layer to the top of the color layer away from the bonding layer.

* * * * *